United States Patent
Deng

(10) Patent No.: US 8,205,664 B2
(45) Date of Patent: Jun. 26, 2012

(54) COMBINATION HEAT SINK

(75) Inventor: Chun-Hao Deng, Taipei Hsien (TW)

(73) Assignee: Kwo Ger Metal Technology, Inc., Shulin, Taipei Hsien (TW)

( * ) Notice: Subject to any disclaimer, the term of this patent is extended or adjusted under 35 U.S.C. 154(b) by 1073 days.

(21) Appl. No.: 12/123,448

(22) Filed: May 19, 2008

(65) Prior Publication Data
US 2009/0284920 A1    Nov. 19, 2009

(51) Int. Cl.
*F28F 7/00* (2006.01)
(52) U.S. Cl. .................... 165/80.3; 165/80.2
(58) Field of Classification Search .......... 165/80.1, 165/80.2, 80.3
See application file for complete search history.

(56) References Cited

U.S. PATENT DOCUMENTS

| | | | | |
|---|---|---|---|---|
| 6,765,799 | B1 * | 7/2004 | Huang | 361/709 |
| 7,025,122 | B2 * | 4/2006 | You-Tien | 165/80.3 |
| 7,032,650 | B1 * | 4/2006 | Tian | 165/80.3 |
| 2003/0116304 | A1 * | 6/2003 | Ho et al. | 165/80.3 |
| 2004/0150955 | A1 * | 8/2004 | Lin | 361/709 |
| 2004/0182543 | A1 * | 9/2004 | Shao | 165/80.3 |
| 2005/0022972 | A1 * | 2/2005 | Cheng-Tung et al. | 165/80.3 |

* cited by examiner

*Primary Examiner* — Teresa Walberg
(74) *Attorney, Agent, or Firm* — Muncy, Geissler, Olds & Lowe, PLLC

(57) ABSTRACT

A combination heat sink form of a stack of radiation fins is disclosed. Each radiation fin has retaining flanges at two opposite lateral sides for securing another radiation fin. Each retaining flange has a bottom neck perpendicularly extending from the respective radiation fin, two pairs of vertically spaced retaining fingers respectively extending from two opposite lateral sides of the bottom neck in a parallel manner relative to the respective radiation fin for securing another radiation fin, a top retaining notch defined between the two pairs of vertically spaced retaining fingers above the bottom neck for accommodating the bottom neck of another radiation fin, and a retaining gap defined between each two vertically spaced retaining fingers for receiving another radiation fin.

10 Claims, 7 Drawing Sheets

COMBINATION HEAT SINK

BACKGROUND OF THE INVENTION

1. Field of the Invention

The present invention relates to heat sinks and more particularly, to a combination heat sink formed of a stack of radiation fins. Each radiation fin comprises a plurality of retaining flanges symmetrically disposed at two opposite lateral sides in such a manner that the radiation fins are fastened together in a stack by means of forcing the retaining flanges of one radiation fin into engagement with the retaining flanges of another radiation fin.

2. Description of the Related Art

Following fast development of modern technology, advanced desktop and notebook computers of relatively stronger computing function and higher operating speed are continuously developed. However, the internal CPU of a high-speed computer generates a relatively higher amount of heat. During the operation of a high-speed computer, heat must be quickly carried away from the CPU, avoiding malfunctioning or failure of the CPU. In order to effectively remove heat from the CPU of a computer, a heat sink may be used with an electric fan. During operation, the heat transfer bottom block of the heat sink absorbs heat energy from the CPU and transfers absorbed heat energy to the radiation fins, and at the same time the electric fan causes currents of air toward the radiation fins of the heat sink, carrying heat energy away from the radiation fins to the outside open air. To enhance the heat dissipation efficiency, the number of the radiation fins and the speed of revolution of the electric fan may be increased. However, the thickness of the radiation fins must be reduced so that the number of the radiation fins can be increased without changing the dimension of the heat sink. According to conventional heat sink fabrication methods, radiation fins are bonded to a heat transfer bottom block by welding. It is difficult to weld a big number of thin radiation fins to the limited surface area of a heat transfer bottom block. A small welding error may result in improper positioning of radiation fins. To eliminate this problem, combination heat sinks are developed.

FIGS. 7 and 8 show a prior art design of combination heat sink. According to this design, the combination heat sink A is formed by fastening a number of radiation fins A1 in a stack. Each radiation fin A1 has one side terminating in a coupling flange A11. The coupling flange A11 has a front protrusion A111 and a back recess A112. By means of press-fitting the front protrusion A111 of the coupling flange A11 of one radiation fin A1 into the back recess A112 of the coupling flange A11 of another radiation fin A1, a predetermined number of the radiation fins A1 are fastened together in a stack. According to this design, the connection between each two adjacent radiation fins A1 is not highly stable. The engagement between the front protrusion A111 of one radiation fin A1 and the back recess A112 of another radiation fin A1 prohibits the two radiation fins A1 from movement relative to each other in vertical direction, however it cannot prohibit the two radiation fins A1 from relative movement in transverse direction. During installation of the aforesaid prior art design of combination heat sink A, the radiation fins A1 may vibrate or move from one another out of position, lowering the performance.

Therefore, it is desirable to provide a combination heat sink that eliminates the aforesaid problems.

SUMMARY OF THE INVENTION

The present invention has been accomplished under the circumstances in view. It is the main object of the present invention to provide a combination heat sink formed of a plurality of radiation fins that can easily be assembled without any tools, and effectively prohibits displacement of the radiation fins when assembled.

To achieve this and other objects of the present invention, the combination heat sink comprises a plurality of radiation fins arranged in a stack. Each radiation fin comprises a plurality of retaining flanges symmetrically disposed at two opposite lateral sides thereof in such a manner that the radiation fins are fastened together in a stack by means of forcing the retaining flanges of one radiation fin into engagement with the retaining flanges of another radiation fins. Each retaining flange comprises a bottom neck perpendicularly extending from the respective radiation fin, two pairs of vertically spaced retaining fingers respectively extending from two opposite lateral sides of the topmost edge of the bottom neck in a parallel manner relative to the respective radiation fin for securing another radiation fin, a top retaining notch defined between the two pairs of vertically spaced retaining fingers above the bottom neck for accommodating the bottom neck of another radiation fin, and a retaining gap defined between each two vertically spaced retaining fingers for receiving another radiation fin.

DETAILED DESCRIPTION OF THE PREFERRED EMBODIMENT

Figure 1:
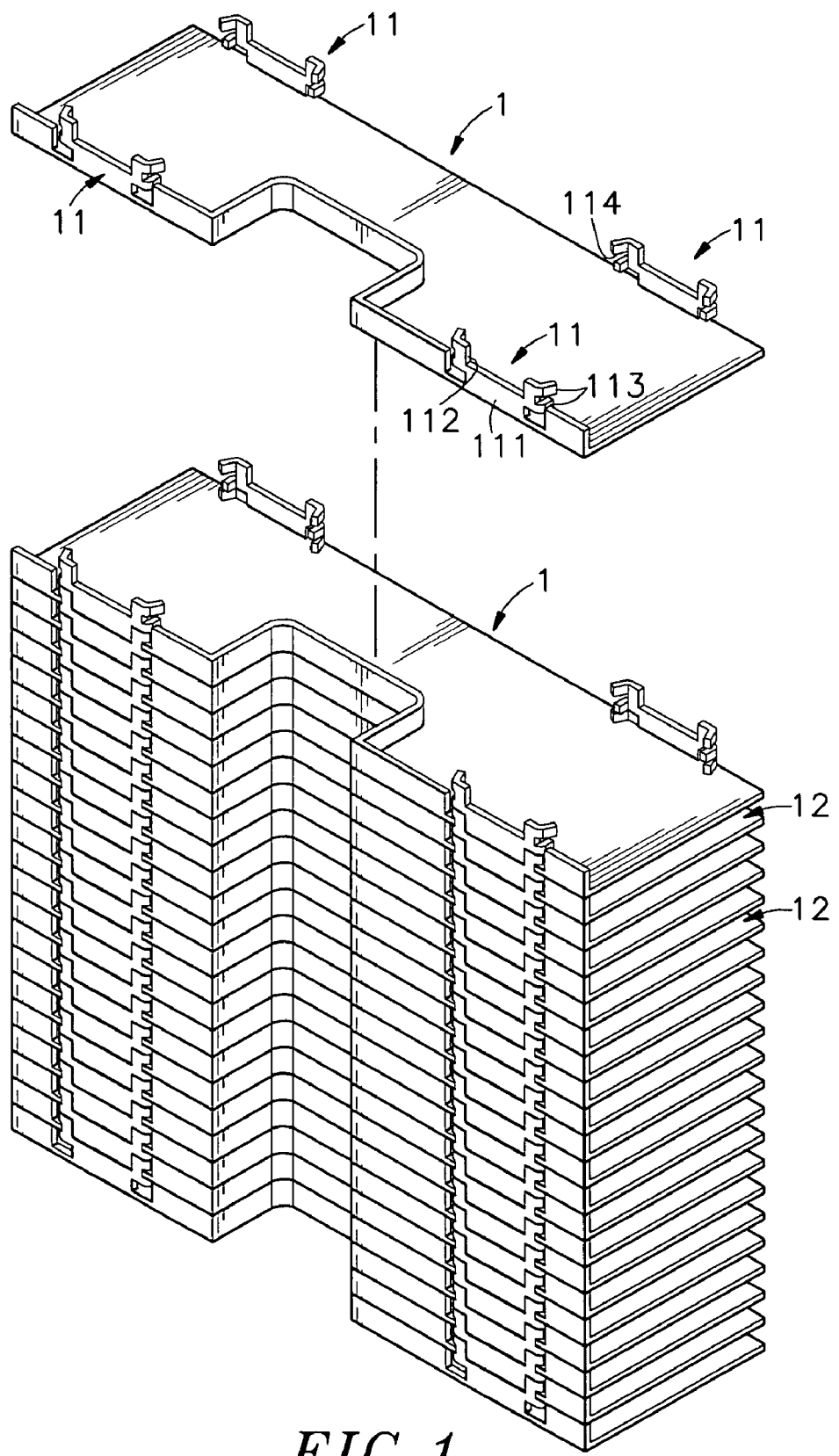
FIG. 1 is an elevational view of a heat sink in accordance with the present invention.
Figure 2:
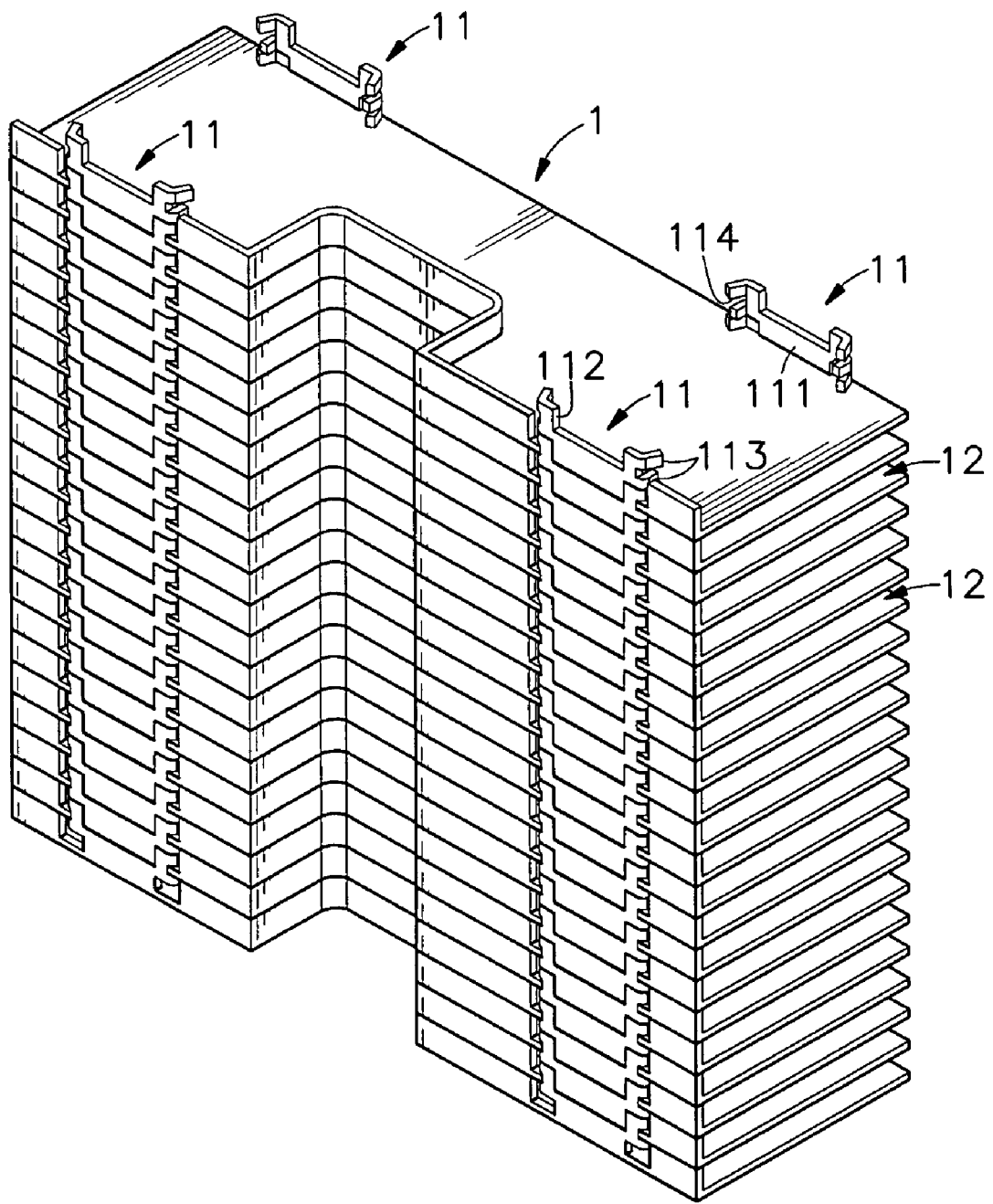
FIG. 2 is an elevational assembly view of the heat sink in accordance with the present invention.
Figure 3:
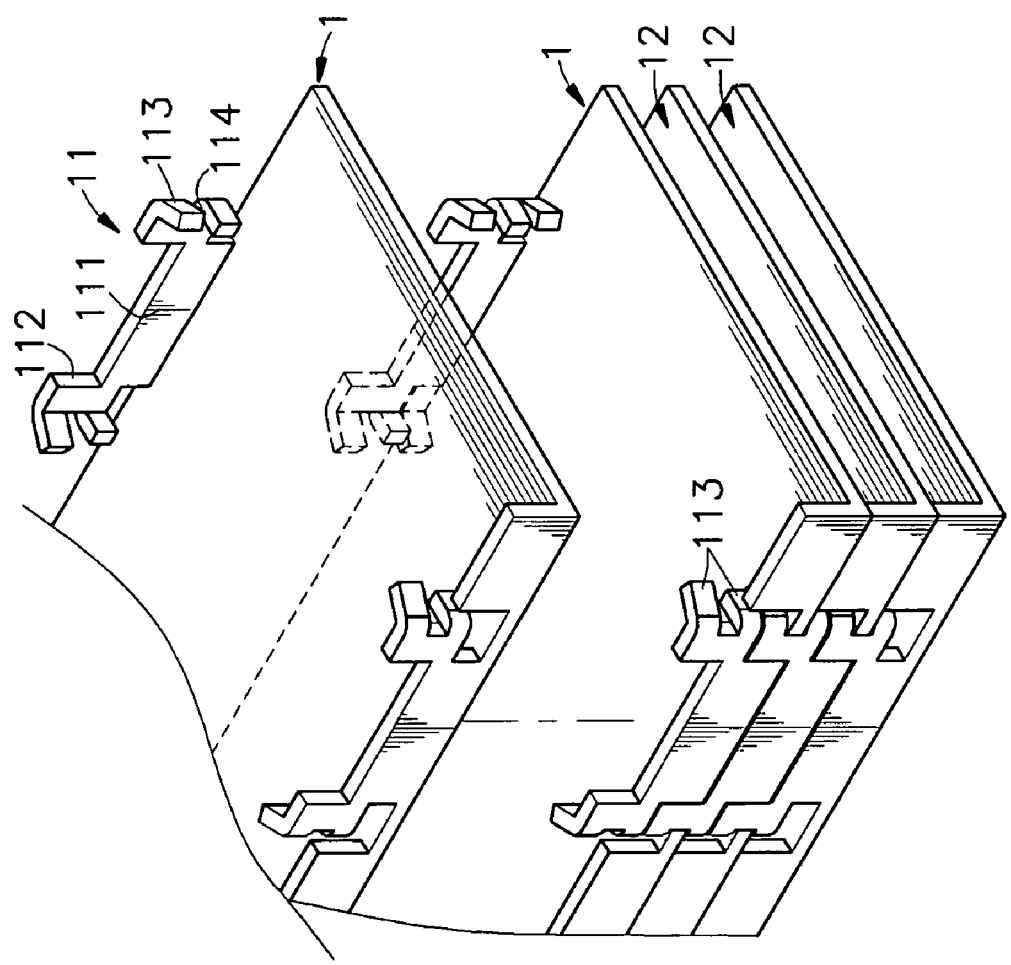
FIG. 3 is an enlarged view of a part of FIG. 1.

Referring to FIGS. 1-3, a combination heat sink in accordance with the present invention is shown comprised of a number of radiation fins 1 arranged in a stack.

The radiation fins 1 are respectively made out of a metal sheet material through a stamping technique. Each radiation fin 1 has a plurality of retaining flanges 11 symmetrically arranged at two opposite sides. When stacking the radiation fins 1, the retaining flanges 11 of one radiation fin 1 are respectively forced into engagement with the retaining flanges 11 of another radiation fin 1, and therefore the radiation fins 1 are positively secured together, forming the desired combination heat sink. Each retaining flange 11 comprises a bottom neck 111 perpendicularly extending from the respective radiation fin 1, two pairs of vertically spaced retaining fingers 113 respectively extending from two opposite lateral sides of the topmost edge of the bottom neck 11 in a parallel manner relative to the respective radiation fin 1, a top retaining notch 112 defined between the two pairs of vertically spaced retaining fingers 113 above the bottom neck 111, and a retaining gap 114 defined between each two vertically spaced retaining fingers 113. The top retaining notch 112 has a transverse width approximately equal to the transverse width of the bottom neck 111. Further, the two vertically spaced retaining fingers 113 are respectively extended from the associating bottom neck 111 at different angles, for example, the bottom-sided retaining finger 113 preferably extends from the associating bottom neck 111 at the angle of 90-degrees; the top-sided retaining finger 113 preferably extends from the associating bottom neck 111 at an angle greater than 90-degrees. When two radiation fins 1 are arranged in a stack, the upper radiation fin 1 is engaged into the retaining gap 114 defined between each two vertically spaced retaining fingers 113 of each of the retaining flanges 11 of the lower radiation fin 1, the bottom necks 111 of the retaining flanges 11 of the upper radiation fin 1 are respectively engaged into the top retaining notches 112 of the retaining flanges 11 of the lower radiation fin 1, and the top-sided retaining fingers 113 of each of the retaining flanges 11 of the lower radiation fin 1 are respectively engaged into the retaining gap 114 defined between the two vertically spaced retaining fingers 113 of each of the retaining flanges 11 of the upper radiation fin 1, and therefore the two radiation fins 1 are prohibited from displacement relative to each other in any direction. By means of forcing the retaining flanges 11 of one radiation fin 1 into engagement with the retaining flanges 11 of another radiation fin 1, a predetermined number of the radiation fins 1 are positively arranged in a stack, forming the desired combination heat sink.

Figure 4:
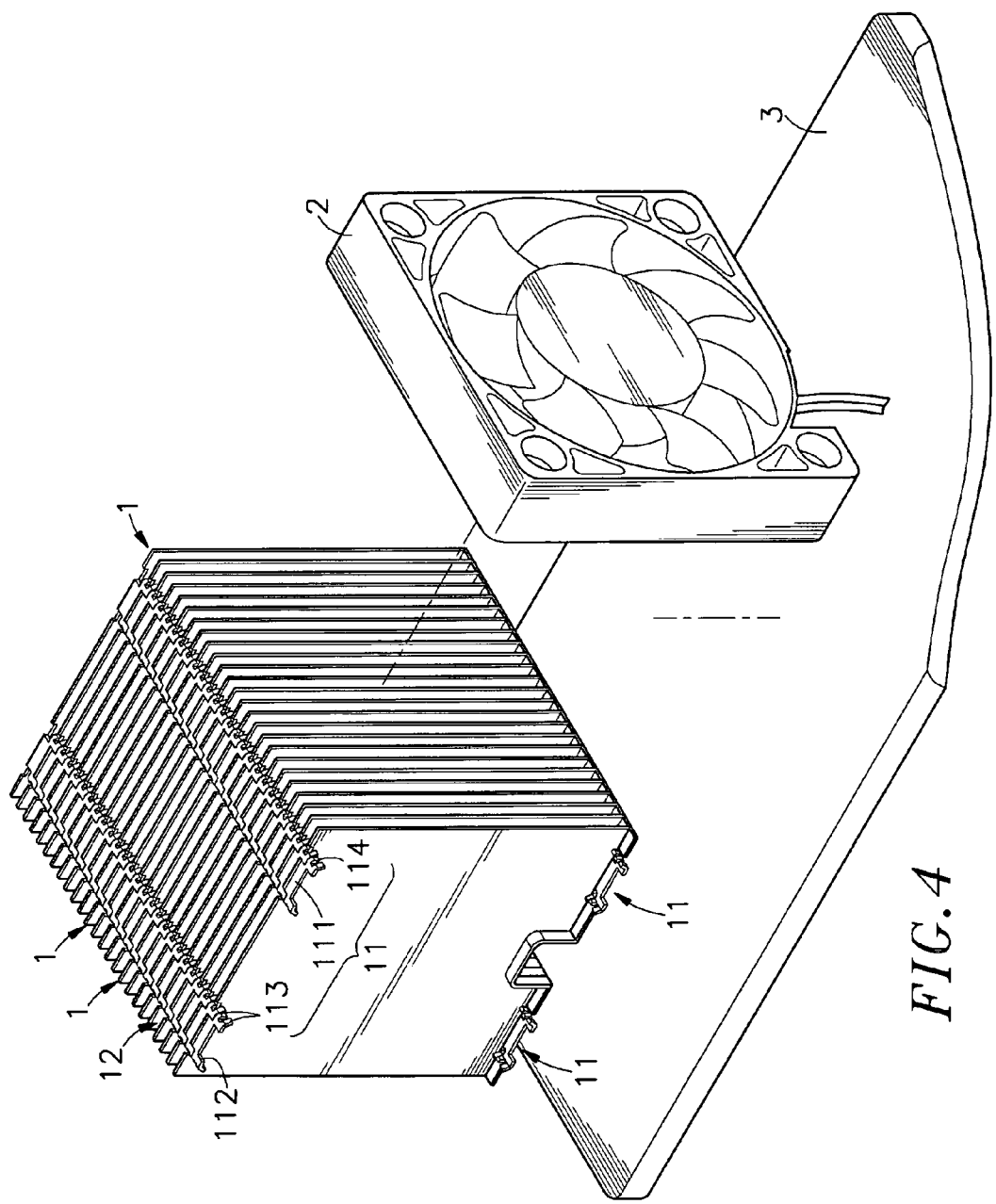
FIG. 4 is an applied view of the present invention, showing the use of the combination heat sink with an electric fan before installation in a heat transfer panel.
Figure 5:
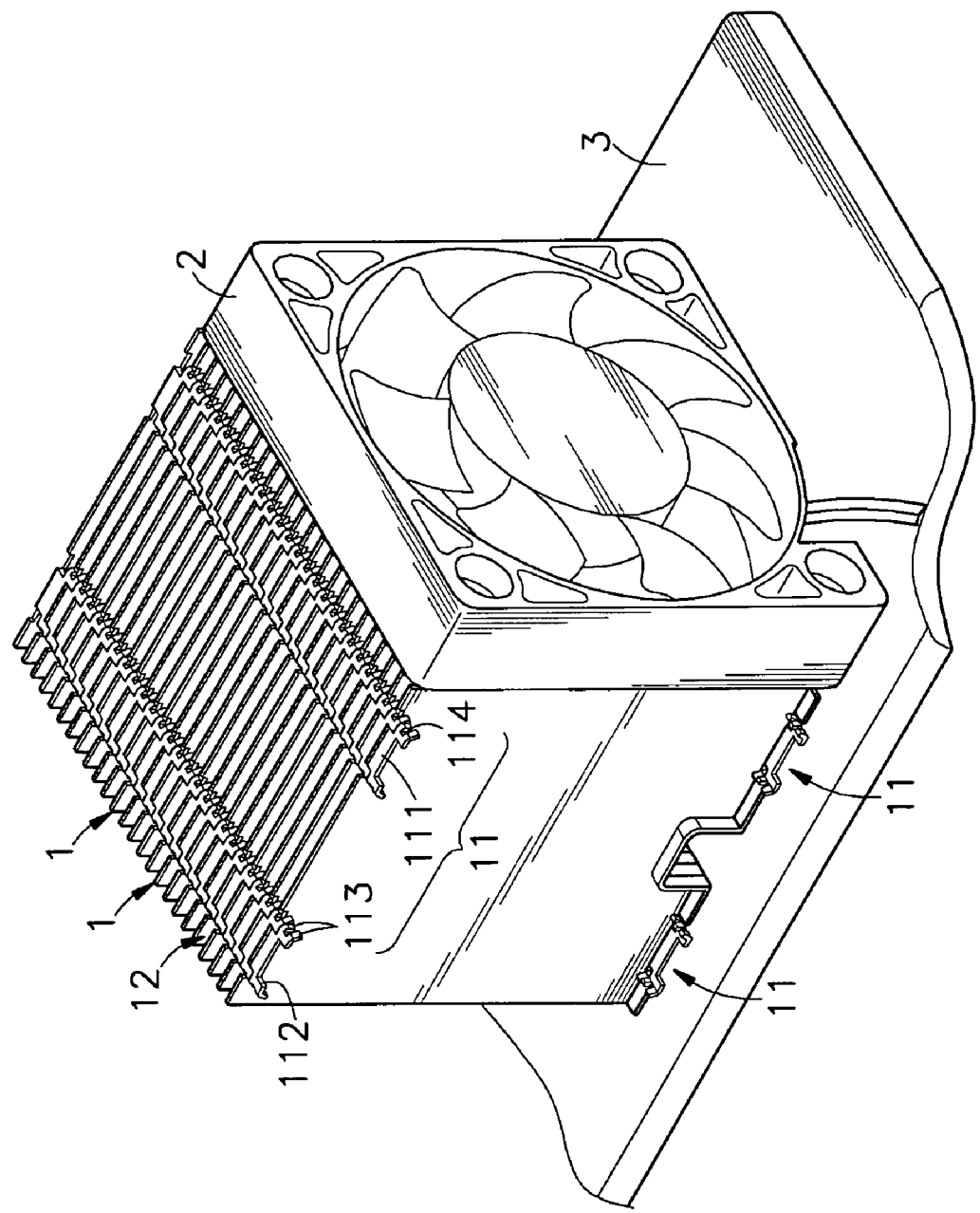
FIG. 5 is an assembly view of FIG. 4.

Referring to FIGS. 4 and 5, a combination heat sink formed of a predetermined number of the radiation fins 1 can be used with an electric fan 2 and affixed with the electric fan 2 to a heat transfer panel 3 for mounting on a circuit board (not shown). Alternatively, a combination heat sink formed of a predetermined number of the radiation fins 1 can be mounted on a heat transfer panel 3 directly, and a lateral side of the radiation fins 1 away from the heat transfer panel 3 is used to affixed with a electric fan 2. The combination heat sink can be fixedly fastened to the heat transfer panel 3 by means an adhesive, welding or any of a variety of conventional mounting techniques. When in use, the heat transfer panel 3 transfers heat energy from a heat source, for example, CPU (not shown) at the circuit board to the radiation fins 1 of the combination heat sink, and the electric fan 2 causes currents of air through a gap in between each two adjacent radiation fins 1 of the combination heat sink to carry heat away from the radiation fins 1 rapidly.

Figure 6:
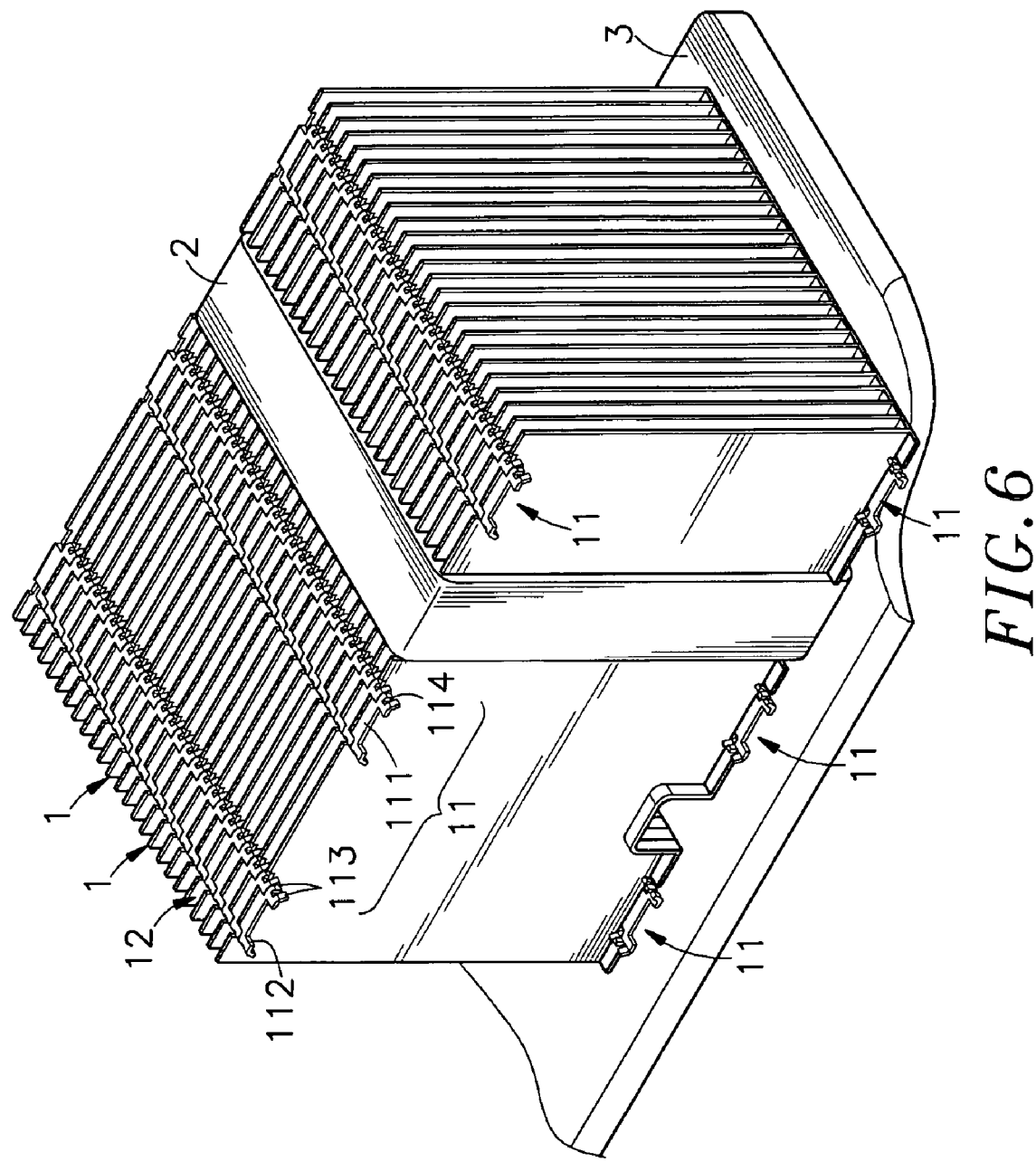
FIG. 6 illustrates another application example of the present invention.
Figure 7:
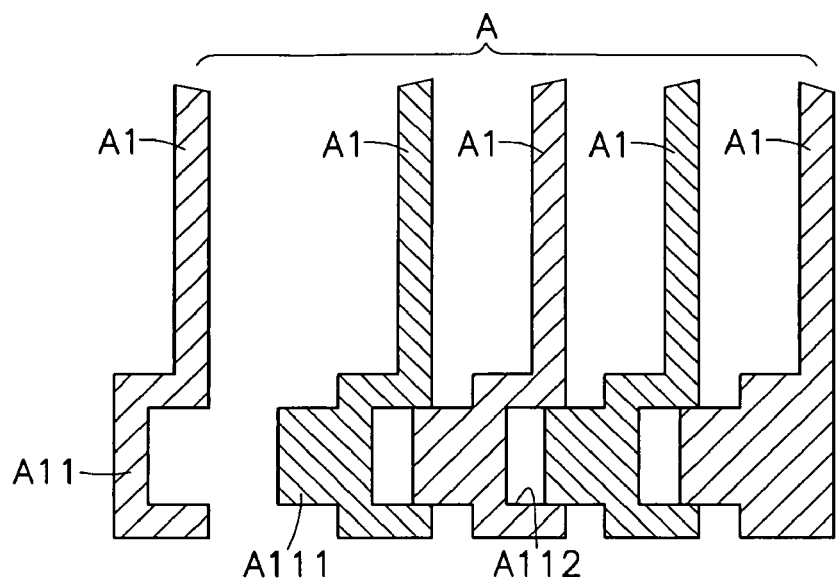
FIG. 7 is an exploded, sectional side view of a heat sink according to the prior art.
Figure 8:
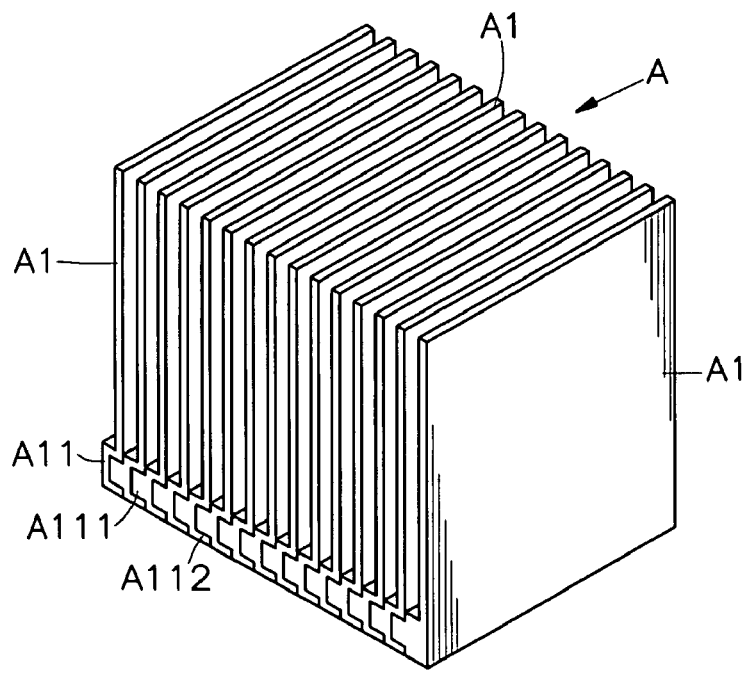
FIG. 8 is an elevational assembly view of the prior art heat sink.

FIG. 6 shows another application example of the present invention. According to this application example, two set of different sizes of radiation fins 1 are respectively assembled to form two different sizes of combination heat sinks, and the two combination heat sinks are attached to two opposite sides of an electric fan 2 and affixed with the electric fan 2 to a heat transfer panel 3.

As stated above, the invention provides a combination heat sink formed of a stack of radiation fins 1. Each radiation fin 1 comprises a plurality of retaining flanges 11 symmetrically arranged at two opposite sides. Each retaining flange 11 comprises a bottom neck 111 perpendicularly extending from the respective radiation fin 1, two pairs of vertically spaced retaining fingers 113 respectively extending from two opposite lateral sides of the topmost edge of the bottom neck 11 at a predetermined angle, a top retaining notch 112 defined between the two pairs of vertically spaced retaining fingers 113 above the bottom neck 111, and a retaining gap 114 defined between each two vertically spaced retaining fingers 113. By means of attaching the vertically spaced retaining fingers 113 of one radiation fin 1 to the top and bottom surface of another radiation fin 1, and the bottom necks 111 of the retaining flanges 11 of one radiation fin 1 be respectively secured to the retaining notches 112 of another radiation fin 1, a number of radiation fins 1 are positively secured together in a stack to form the desired combination heat sink and prohibited from displacement relative to one another.

A prototype of combination heat sink has been constructed with the features of FIGS. 1-6. The combination heat sink functions smoothly to provide all of the features discussed earlier.

Although particular embodiments of the invention have been described in detail for purposes of illustration, various modifications and enhancements may be made without departing from the spirit and scope of the invention.

What the invention claimed is:

1. A combination heat sink comprising a plurality of radiation fins arranged in a stack, each said radiation fin comprising a plurality of retaining flanges symmetrically disposed at two opposite lateral sides thereof in such a manner that said radiation fins are fastened together in a stack by means of forcing said retaining flanges of one said radiation fin into engagement with said retaining flanges of another one of said radiation fins, each said retaining flange comprising a bottom neck perpendicularly extending from said respective radiation fin, two pairs of vertically spaced retaining fingers respectively extending from two opposite lateral sides of the topmost edge of said bottom neck in a parallel manner relative to said respective radiation fin for securing another one of said radiation fins, a top retaining notch defined between said two pairs of vertically spaced retaining fingers above said bottom neck for accommodating said bottom neck of another one of said radiation fins, and a retaining gap defined between each two vertically spaced retaining fingers for receiving another one of said radiation fins.

2. The combination heat sink as claimed in claim 1, wherein said top retaining notch has a transverse width approximately equal to the transverse width of said bottom neck.

3. The combination heat sink as claimed in claim 1, wherein said retaining gap has a vertical height approximately equal to the thickness of each said radiation fin.

4. The combination heat sink as claimed in claim 1, wherein said two vertically spaced retaining fingers of each said retaining flange are respectively extended from said associating bottom neck at different angles.

5. The combination heat sink as claimed in claim 4, wherein said two vertically spaced retaining fingers include one top retaining finger and one bottom retaining finger respectively attached to top and bottom surfaces of another one of said radiation fins.

6. The combination heat sink as claimed in claim 5, wherein said bottom retaining finger extends from said associating bottom neck in a parallel manner relative to said respective radiation fin at 90-degrees angle and attached to the bottom surface of the another one of said radiation fins.

7. The combination heat sink as claimed in claim 1, wherein each said radiation fin has one side fastened to an electric fan so that current of airs caused by said electric fan go through a gap in between each two adjacent radiation fins to carry heat away from said radiation fins.

8. The combination heat sink as claimed in claim 1, further comprising a heat transfer panel fixedly bonded to a bottom side of the stack of said radiation fins with an adhesive.

9. The combination heat sink as claimed in claim 1, further comprising a heat transfer panel fixedly bonded to a bottom side of the stack of said radiation fins by welding.

10. The combination heat sink as claimed in claim 1, further comprising a heat transfer panel fixedly bonded to a bottom side of the stack of said radiation fins by a surface mounting technique.

* * * * *